US012645992B2

(12) United States Patent
Teng et al.

(10) Patent No.: US 12,645,992 B2
(45) Date of Patent: Jun. 2, 2026

(54) SEMICONDUCTOR METROLOGY SYSTEM AND METHOD

(71) Applicant: Taiwan Semiconductor Manufacturing Company, Hsinchu (TW)

(72) Inventors: Yun-Chung Teng, Hsinchu (TW); Jan-Hau Chang, Hsinchu (TW); Hsien-Hung Chang, Hsinchu (TW); Ming-Hsiung Fu, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 713 days.

(21) Appl. No.: 18/093,181

(22) Filed: Jan. 4, 2023

(65) Prior Publication Data

US 2024/0193473 A1      Jun. 13, 2024

Related U.S. Application Data

(60) Provisional application No. 63/432,179, filed on Dec. 13, 2022.

(51) Int. Cl.
| | |
|---|---|
| *G06N 20/00* | (2019.01) |
| *G01N 23/207* | (2018.01) |
| *G06F 18/27* | (2023.01) |
| *H10P 74/20* | (2026.01) |

(52) U.S. Cl.
CPC ......... *G06N 20/00* (2019.01); *G01N 23/2076* (2013.01); *G06F 18/27* (2023.01); *H10P 74/203* (2026.01)

(58) Field of Classification Search
CPC .... G06N 20/00; G01N 23/2076; G06F 18/27; H10P 74/203
USPC ..... 706/12, 13, 16, 20, 46, 48; 707/999.107, 707/999.104, 17.008; 438/7, 8, 14, 16, 438/690, 691, 692; 356/369, 392, 394, 356/497, 511, 601, 625, 630
See application file for complete search history.

(56) References Cited

U.S. PATENT DOCUMENTS

| | | | |
|---|---|---|---|
| 9,995,689 B2 * | 6/2018 | Vagos | G01N 21/55 |
| 2005/0185197 A1 * | 8/2005 | Tao | H10P 74/203 356/625 |
| 2009/0153842 A1 * | 6/2009 | Kaushal | G01N 21/95607 356/73 |
| 2018/0108578 A1 * | 4/2018 | Pandev | H10P 74/203 |

(Continued)

*Primary Examiner* — Md I Uddin
(74) *Attorney, Agent, or Firm* — Lippes Mathias LLP

(57) ABSTRACT

A machine learning system and method for optical critical dimension measurement. From a training set of spectra and references, features are extracted and subjected to regression analysis to generate predictor variables. Using feature functions, inverse feature functions, a machine-learning predictor component and masks, a machine-learning optical critical dimension explainer is generated. A wafer is analyzed by metrology tools and the machine-learning predictor component calculates a critical dimension inference from measured spectra. Theoretical spectra are then generated by the predictor component based upon a modification of the critical dimension inference. The measured spectra are compared to the theoretical spectra and the fit of the measured spectra to the theoretical spectra is evaluated for acceptance. The results of the comparison and analysis is output in human readable form.

17 Claims, 12 Drawing Sheets

(56) References Cited

U.S. PATENT DOCUMENTS

| 2018/0112968 | A1* | 4/2018 | Chen | ...................... | G01B 11/02 |
| 2019/0148246 | A1* | 5/2019 | Zhan | ..................... | H10P 74/203 |
| | | | | | 438/14 |

* cited by examiner

START

RETRIEVE TRAINING SET ~ 1002

EXTRACT FEATURES ~ 1004

APPLY FEATURE FUNCTION ~ 1006

PERFORM REGRESSION ANALYSIS ~ 1008

GENERATE PREDICTOR VARIABLES ~ 1010

GENERATE MASK ~ 1012

GENERATE INVERSE FEATURE FUNCTIONS ~ 1014

GENERATE ML-OCD EXPLAINER ~ 1016

OUTPUT HUMAN-READABLE OCD DATA ~ 1018

END

1000

SEMICONDUCTOR METROLOGY SYSTEM AND METHOD

PRIORITY CLAIM AND CROSS-REFERENCE

This application claims the benefit of U.S. Provisional Application Ser. No. 63/432,179 filed Dec. 13, 2022, and titled A SEMICONDUCTOR METROLOGY SYSTEM AND METHOD. U.S. Provisional Application Ser. No. 63/432,179 filed Dec. 13, 2022, and titled A SEMICONDUCTOR METROLOGY SYSTEM AND METHOD is incorporated herein by reference in its entirety.

BACKGROUND

Semiconductor manufacturing requires the inspection of small and complex three-dimensional structures. Optical critical dimension (OCD) metrology represents an inspection process that utilizes the reflection/refraction of wavelengths of light, X-rays, or the like, for quality control. This type of inspection uses substantial computing power and requires extended periods of time for analysis.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
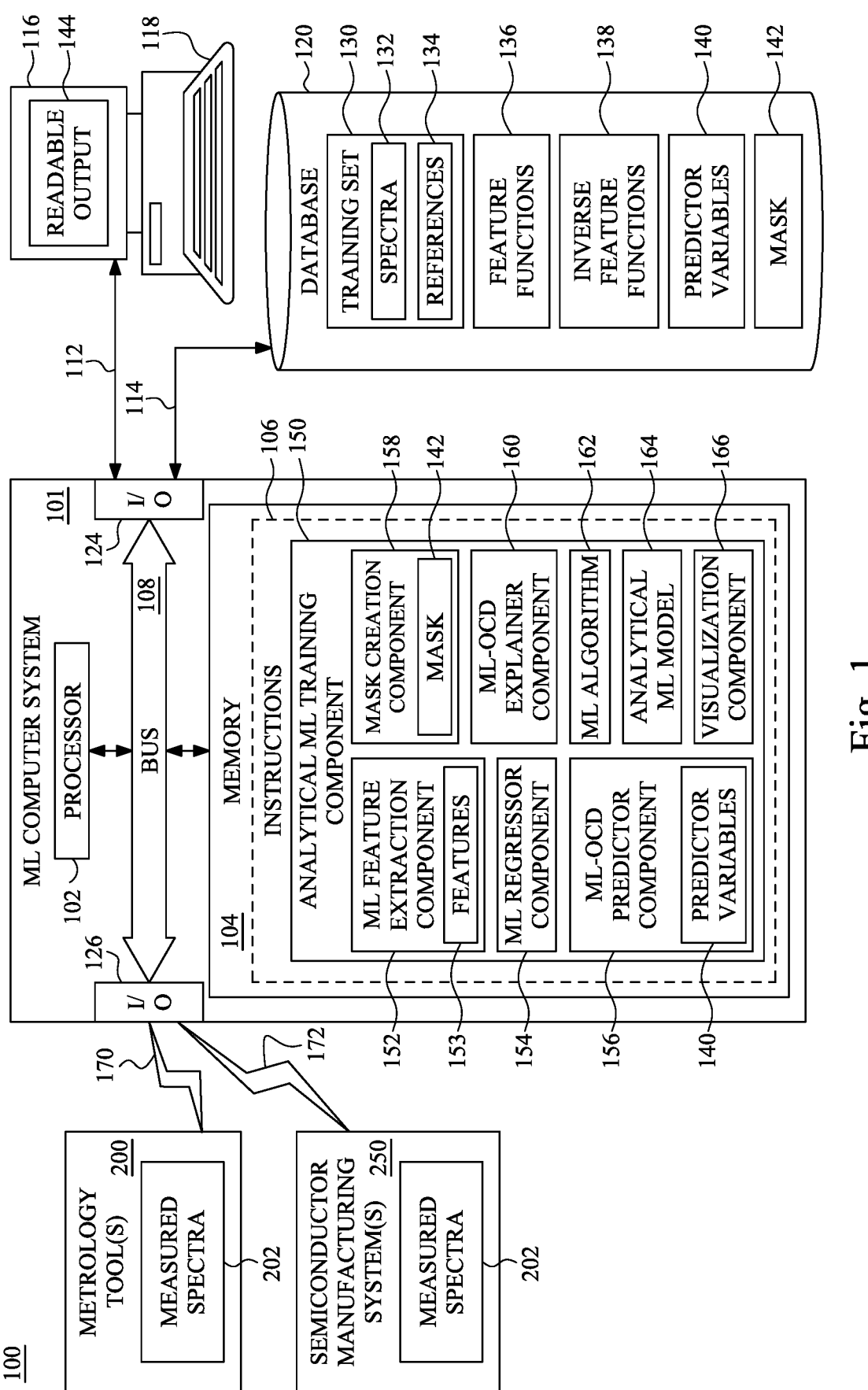
FIG. 1 is a block diagram of a machine learning system for metrology operations associated with semiconductor manufacturing in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Semiconductor manufacturing requires the inspection of small and complex three-dimensional structures. As the structures, layers, materials deposited on wafers and used to form complex circuitry shrink, optical critical dimension (OCD) metrology has the fundamental capability needed for the measurements. The resolution of image based optical systems using visible light is limited by diffraction effects to about half a micrometer. The critical dimensions (CD) of semiconductor devices shrank below this limit some time ago. Optical systems were replaced by scanning electron microscopes for CD measurements (CD-SEM). As device sizes continued to shrink and dimensions of the smallest features have surpassed the measurement capabilities of CD-SEM and CD measurements had to include embedded features, manufacturers have adopted OCD, a non-image-based optical technology. OCD looks at scattering patterns in light reflected and transmitted by the measured features. That is, OCD is a type of metrology technique that measures the critical dimension of the semiconductor device structure on semiconductor wafers using optical spectra. When implemented on a spectroscopic ellipsometer, which captures the effects of the sample interaction with polarized light, OCD can provide fast, in-line, non-destructive characterization of the dimensions, composition, shapes, and more of complex three-dimensional features with sub-Angstrom sensitivity. Its 3D capabilities have become increasingly important for advanced devices as planar CMOS technology gives way to three-dimensional structures, including finFETs, gate-all-around (GAA) transistors, and stacked, high-aspect-ratio memory designs.

Turning now to FIG. 1, there is shown an illustrative diagram of a machine learning system 100 for metrology operations associated with semiconductor manufacturing in accordance with one embodiment of the subject application. As shown in FIG. 1, the machine learning system 100 includes a machine learning (ML) computer system 101 in communication with a plurality of different devices, e.g., metrology tools 200, semiconductor manufacturing systems 250, and the like.

The various components of the ML computer system 101 may be connected by a data/control bus 108. The processor 102 of the ML computer system 101 is in communication with an associated database 120 via a link 114. A suitable communications link 114 may include, for example, a switched telephone network, a wireless radio communications network, infrared, optical, or other suitable wired or wireless data communications. The database 120 is capable of implementation on components of the ML computer system 101, e.g., stored in local memory 104, i.e., on hard drives, virtual drives, or the like, or on remote memory accessible to the ML computer system 101.

The associated database 120 is representative of any organized collections of data (e.g., process tool information, fabrication information, metrology procedures, material information, layout information, etc.) used for one or more purposes. Implementation of the associated database 120 is capable of occurring on any mass storage device(s), for example, magnetic storage drives, a hard disk drive, optical storage devices, flash memory devices, or a suitable combination thereof. The associated database 120 may be implemented as a component of the ML computer system 101, e.g., resident in memory 104, or the like. In one embodiment, the associated database 120 may include data corresponding to, for example and without limitation, production scheduling, wafer positioning, process chamber information (e.g. type, position, status, etc.), optical critical dimension (OCD) information, learning algorithms, graphical user interfaces, and the like.

Figure 2:
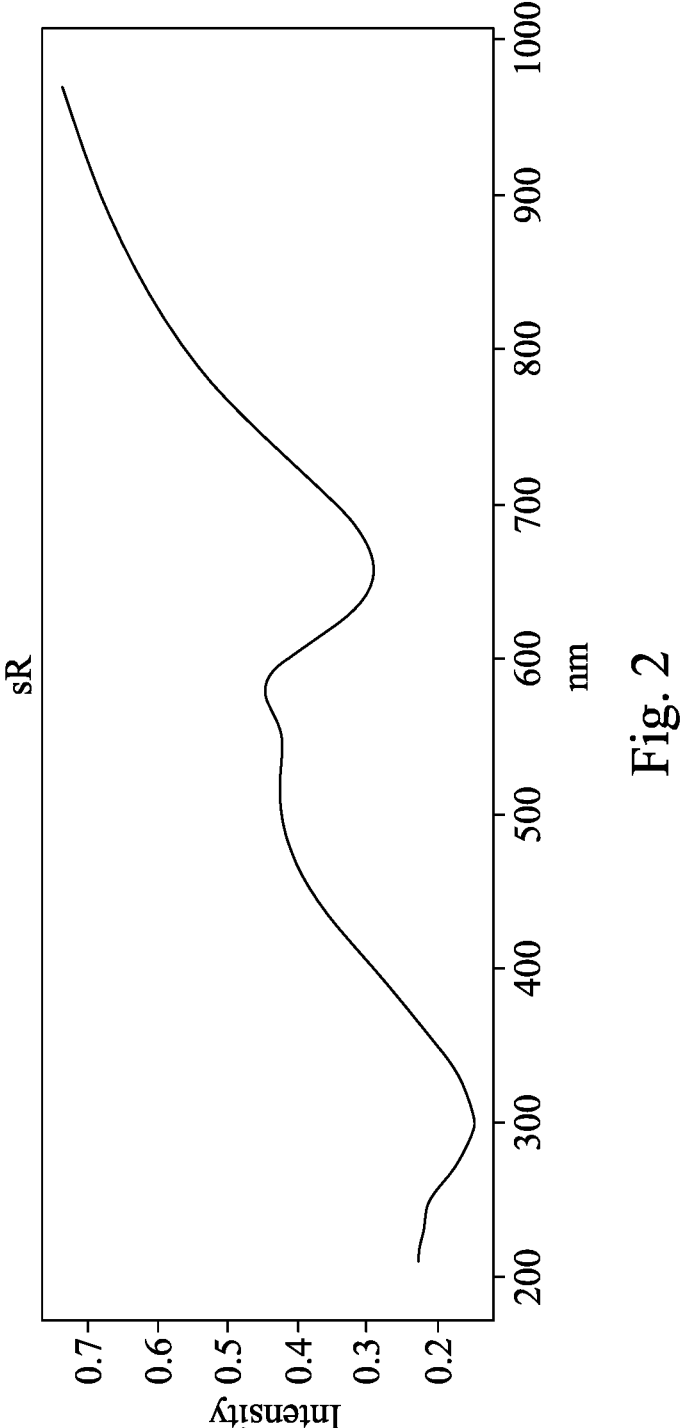
FIG. 2 is an illustrative graph of one spectrum of one channel of spectra in accordance with one embodiment.

In one embodiment, the associated database 120 stores information utilized by the ML computer system 101 to perform metrology operations and implement machine learning solutions. As illustrated in FIG. 1, the database 120 may store a training set 130 comprising spectra 132 and references 134, feature functions 136, inverse feature functions 138, predictor variables 140, masks 142, and the like. In accordance with some embodiments, the training set 130 corresponds to data collected relating to the spectra 132, i.e., response signals of incident radiation interacting with the wafer or material structure of interest. Stated another way, the spectra 132 corresponds to a form of data which describes physical parameters (e.g., light intensity, power, phase, etc.), as a function of frequency or wavelength. FIG. 2 provides an illustrative nonlimiting example of one spectrum of one channel, where the Y axis corresponds to intensity and the X axis corresponds to wavelength. It will be appreciated that the spectra 132 of the training set 130 may utilize multiple channels. The references 134 may correspond to critical dimension parameters obtained by other means of measurement, e.g., TEM (transmission electron microscopes), SEM (scanning electron microscopes), or the like.

The feature functions 136 i.e., mathematical functions used for extracting the aforementioned features from raw data, such as, for example and without limitation, dimension reduction functions. In some embodiments, the inverse feature functions 138 stored in the database 120 may correspond to mathematical formulae that may be used for reconstructing signals in feature form back into the form of raw data, i.e., spectra 132. For a well-trained ML solution, the reconstructed spectra contain mostly reference-relevant signals and can be viewed as the general form of spectra since they can output identical results to the original one without reference-irrelevant signal (e.g., noise). The transformation is applied by the inverse functions 138 of the feature functions 136 used. These feature functions 136 are better to be invertible, but the process is not limited to lossless data functions (functions that work without loss of information). In some example embodiments, the following function may be used:

Let f be the feature transformation function, f−1 be the inverse feature transformation function, X be spectra raw data, Y be the features, i.e., f(X)=Y and f−1(Y')=X'. In the inverse feature transformation, the input is feature selected (Y') is the feature matrix processed by a mask) and the output is reconstructed spectra (X') which seems like the original one X.

As indicated above, the associated database 120 may further store predictor variables 140 utilized by ML computer system 101, as discussed in greater detail below. As will be appreciated, the predictor variables 140 may correspond to the clues, i.e., inputs, given to a model in order to determine what target variable to assign to each example. It will further be appreciated that the selected predictor variables 140 may depend in part on the type of values used to represent them. As further illustrated in FIG. 1, the associated database 120 may also store one or more masks 142 for use by the ML computer system 101. In some embodiments, the masks 142 may correspond to a method of indicating the elements of a matrix (or vector) that should or should not be used. In accordance with one embodiment, the mask 142 may be implemented as data that is used for bitwise operations. Forms of the mask 142 used in one or more embodiments disclosed herein may include, for example and without limitation, an array of Boolean elements. As illustrated in FIG. 1, the predictor variables 140 and masks 142 may also be stored in memory 104 of the ML computer system 101.

As shown in FIG. 1, the ML computer system 101 may include one or more input/output (I/O) interface devices 124 and 126 for communicating with external devices. The I/O interface 124 may communicate, via communications link 112, with one or more of a display device 116, for displaying information, such estimated destinations, and a user input device 118, such as a keyboard or touch or writable screen, for inputting text, and/or a cursor control device, such as mouse, trackball, or the like, for communicating user input information and command selections to the processor 102. The I/O interface 126 may communicate with external devices such as metrology tools 200, semiconductor manufacturing systems 250, and the like, via a suitable communications links 170, 172. The communications links 170, 172 may comprise any wired or wireless communications means known in the art including, for example and without limitation, 802.11(x), the public-switch telephone network, VLAN, the Internet, Bluetooth, Ethernet, cellular, or any other wired or wireless hardware, software, and/or protocols enabling electronic communication between devices.

It will be appreciated that the ML computer system 101 illustrated in FIG. 1 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 1 as a networked set of components, the ML computer system 101 is capable of implementation on a stand-alone device adapted to interact with the metrology tools 200 and the semiconductor manufacturing systems 250 described herein.

The ML computer system 101 may include one or more of a computer server, workstation, personal computer, cellular telephone, tablet computer, pager, combination thereof, or other computing device capable of executing instructions for performing the exemplary method.

According to one example embodiment, the ML computer system 101 includes hardware, software, and/or any suitable combination thereof, configured to interact with an associated user, a networked device, networked storage, remote devices, or the like.

The memory 104 illustrated in FIG. 1 as a component of the ML computer system 101 may represent any type of non-transitory computer readable medium such as random access memory (RAM), read only memory (ROM), magnetic disk or tape, optical disk, flash memory, or holographic memory. In one embodiment, the memory 104 comprises a combination of random access memory and read only memory. In some embodiments, the processor 102 and memory 104 may be combined in a single chip. The network interface(s) 124, 126 allow the computer to communicate with other devices via a computer network, and may comprise a modulator/demodulator (MODEM). Memory 104 may store data processed in the method as well as the instructions for performing the exemplary method.

The digital processor 102 can be variously embodied, such as by a single core processor, a dual core processor (or more generally by a multiple core processor), a digital processor and cooperating math coprocessor, a digital controller, or the like. The digital processor 102, in addition to controlling the operation of the ML computer system 101 executes instructions 106 stored in memory 104 for performing the method set forth hereinafter.

As shown in FIG. 1, the instructions 106 stored in memory 104 may include an analytical machine learning (ML) training component 150 configured to produce an analytical machine learning model for use in optical critical dimension metrology. In one embodiment, the analytical machine learning model output by the analytical ML training component 150 may reveal the fitting process and signal use in the form of human readable data. The analytical ML training component 150 may utilize one or more additional components, including, for example and without limitation, an ML feature extraction component 152, an ML regressor component 154, an ML-OCD predictor component 156, a mask creation component 158, an ML-OCD explainer component 160, and one or more machine learning algorithms 162. In accordance with one embodiment, machine learning algorithm includes, for example and without limitation, the lasso linear regression algorithm and method, however any suitable type of ML algorithm having one or more "feature selection" function would be applicable for this disclosure. (e.g.: neural network, fast Fourier Transform (FFT), principal component analysis (PCA), support vector machine (SVM), Gaussian processing, ordinary least squares regression (OLSR), linear regression, logistic regression, stepwise regression, multivariate adaptive regression splines (MARS), locally estimated scatterplot smoothing (LOESS), partial least squares regression (PLSR), or the like.

As illustrated in FIG. 1, the analytical ML training component 150 of the instructions 106 stored in memory 104 may also include a machine-learning feature extraction component 152 configured to extract one or more features 153 from the training set 130. According to some embodiments, the features 153 may correspond to characteristics, properties and/or attributes extracted by statistical or machine learning functions from raw data. The extracted features 153 may then be processed utilizing one or more feature functions 136, i.e., mathematical functions used for extracting the aforementioned features 136 from raw data, such as, for example and without limitation, dimension reduction functions.

The analytical ML training component 150 of the instructions 106 stored in memory 104 may also utilize an ML-regressor component 154. In some embodiments, the ML regressor component 154 is configured to perform regression analysis, i.e., the process of estimating the relationship between a dependent variable and independent variables. The analytical ML training component 150 may further utilize a machine learning optical critical dimension (ML-OCD) predictor component 156 configured to generate and/or output predictor variables 140 as inputs to the machine learning algorithm 162 of the analytical machine learning training component 150 (as discussed below). As will be appreciated, the predictor variables 140 may correspond to the clues given to the model so it can decide what target variable to assign to each example. It will further be appreciated that the selected predictor variables 140 may depend in part on the type of values used to represent them. Stated another way, the ML-OCD predictor component 156 identifies features, characteristics, (structural parameters such as length, width, depth, etc., of structures on a wafer) to infer the CD of wafer components. Thus, after training, the ML-OCD predictor component 156 may receive measured spectra 202 of a wafer being analyzed in the metrology tool 200 or in a suitably equipped semiconductor manufacturing system 250 and predict the critical dimensionality of structures thereon, i.e., CD inference.

In addition, the analytical ML training component 150 of the instructions 106 stored in memory 104 may include a mask creation component 158 configured to produce a mask 142 for use by the analytical machine learning training component 150 in OCD operations. As will be appreciated, the mask 142 output by the mask creation component 158 may correspond to a method of indicating the elements of a matrix (or vector) that should or should not be used. In accordance with one embodiment, the mask 142 may be implemented as data that is used for bitwise operations. Using a mask, multiple bits in a byte, nibble, word, etc., may be set either on or off, or inverted from on to off (or vice versa) in a single bitwise operation. As indicated above, the mask 142 used in one or more embodiments disclosed herein may include, for example and without limitation, an array of Boolean elements. In one embodiment, the mask creation component 158 may generate a mask 142 wherein features selected (i.e., variables, characteristics, etc.) selected or output by the ML regressor component 154 and/or ML predictor component 156 are labeled as "true" and vice versa. As indicated above, the mask 142 may be stored in memory 104 of the ML computer system 101, in the associated database 120, or the like. The selection process, as will be understood, may be done by machine learning algorithms 162 to extract reference-relevant signals from features of raw data.

As a result of the interactions of the analytical ML training component 150 (utilizing the machine learning algorithm(s) 162), the ML feature extraction component 152, the ML regressor component 154, the ML-OCD predictor component 156, the mask creation component 158, the aforementioned feature functions 136, inverse feature functions 138, predictor variables 140, masks 142, etc., an analytical ML model 164 is generated for OCD operations. Thereafter, the analytical ML training component 150 produces one or more machine learning optical critical dimension (ML-OCD) explainer component(s) 160 configured to output model spectra and provide visualized CD-sensitive signals in accordance with the ML-OCD predictor component 156. In accordance with some embodiments, the output may be human-readable in format, e.g., graphical, textual, or the like.

Figures 8, 9:
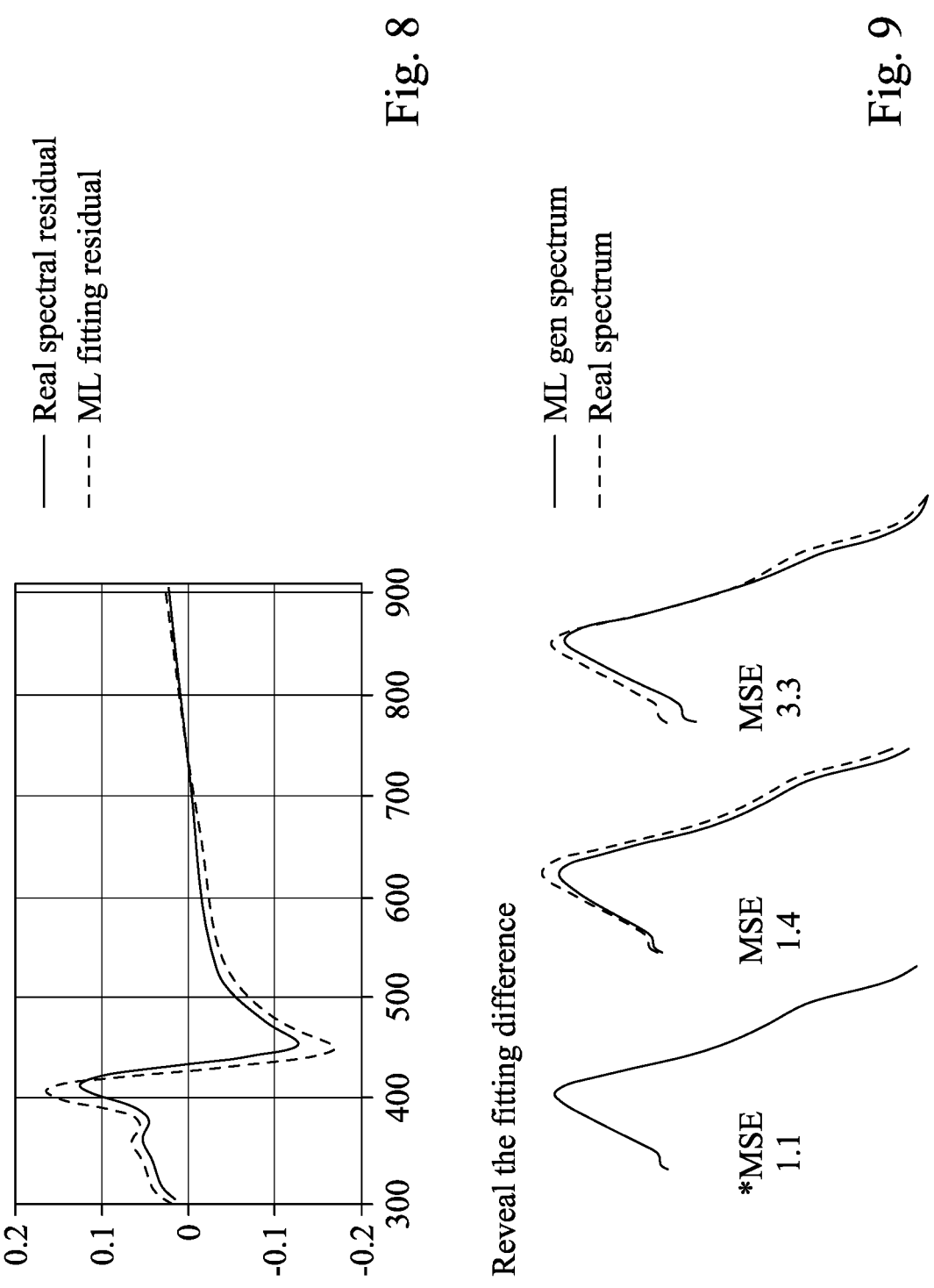
FIG. 8 illustrates a graphical representation of machine learning generated fitting residual versus real (measured) spectral residual in accordance with one embodiment.
FIG. 9 illustrates a graphical representation of machine learning generated spectrum versus real (measured) spectrum in accordance with one embodiment.

In some embodiments, the ML-OCD explainer component 160 may be implemented as a function of the system ML computer system 101 to illustrate where and how the fitting gets better or worse, as depicted in FIGS. 8 and 9. In one embodiment, fitting, as used herein, corresponds to the process of constructing a mathematical function that has the best fit to a series of data points, possibly subject to constraints. Similarly, the fitting quality may be generally quantified as goodness of fit (GOF), which demonstrates how well the statistical/mathematical model fits a set of observations. It will further be appreciated that the physical properties of the sample are inferred from the model spectrum that best fits the measured spectrum. Stated another way, the analytical ML training component 150 produces one or more ML-OCD explainers 160 which can reveal the fitting process and signal use in the form of human-readable data 144 by combining the inverse transformation technique and the mask of ML predictor. The inverse feature functions, along with masks of ML predictors, provide a specific vector, which is correlated to the change of key, in feature space.

The instructions 106 may further include a visualization component 166 configured to generate a visual or human readable output 144 on an associated display (116), regarding the application of the analytical ML model 164 produced by the analytical ML training component 150 used by the ML computer system 101 of OCD analysis of a wafer. In accordance with some embodiments, the readable output 144 may include, for example and without limitation, graphical comparisons, spectra readouts, numerical data, three-dimensional representations, and the like. It will be appreciated that variations on the output of the visualization component 166, i.e., the human readable output 144 provided are contemplated herein.

The various components and hardware described above with respect to FIG. 1 may be configured to perform and implement the methods set forth in greater detail below, e.g., the methods illustrated in the workflow diagrams of FIGS. 3-7.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

The system 100 of FIG. 1 further includes one or more metrology tools 200 in communication with the ML computer system 101 via a suitable communications link 170. In some embodiments, the one or more metrology tools 200 output measured spectra 202 to the ML computer system 101 for use in production of the analytical ML model 164, for incorporation into the training set 130, or the like. According to one embodiment, the one or more metrology tools 200 may include, for example and without limitation, an X-ray specular reflectivity (XRR) device, a spectroscopic ellipsometer, an X-ray fluorescence spectrometer device, an X-ray diffraction device, other reflectometry systems, and the like.

As illustrated in FIG. 1, the system 100 may include one or more semiconductor manufacturing systems 250 in communication with the ML computer system 101 via a suitable communications link 172. In accordance with one embodiment, the one or more semiconductor manufacturing systems 250 may include integrated or attached metrology tools (not shown) that output measured spectra 202 to the ML computer system 101 for use in production of the analytical ML model 164, for incorporation into the training set 130, or the like.

In some embodiments, the ML computer system 101 may send instructions to one or more devices of the semiconductor manufacturing system 250 in accordance with operations of the analytical ML training component 150, application of the analytical ML model 164, and user interactions responsive to the visualization component 166, as will be appreciated.

Figure 3:
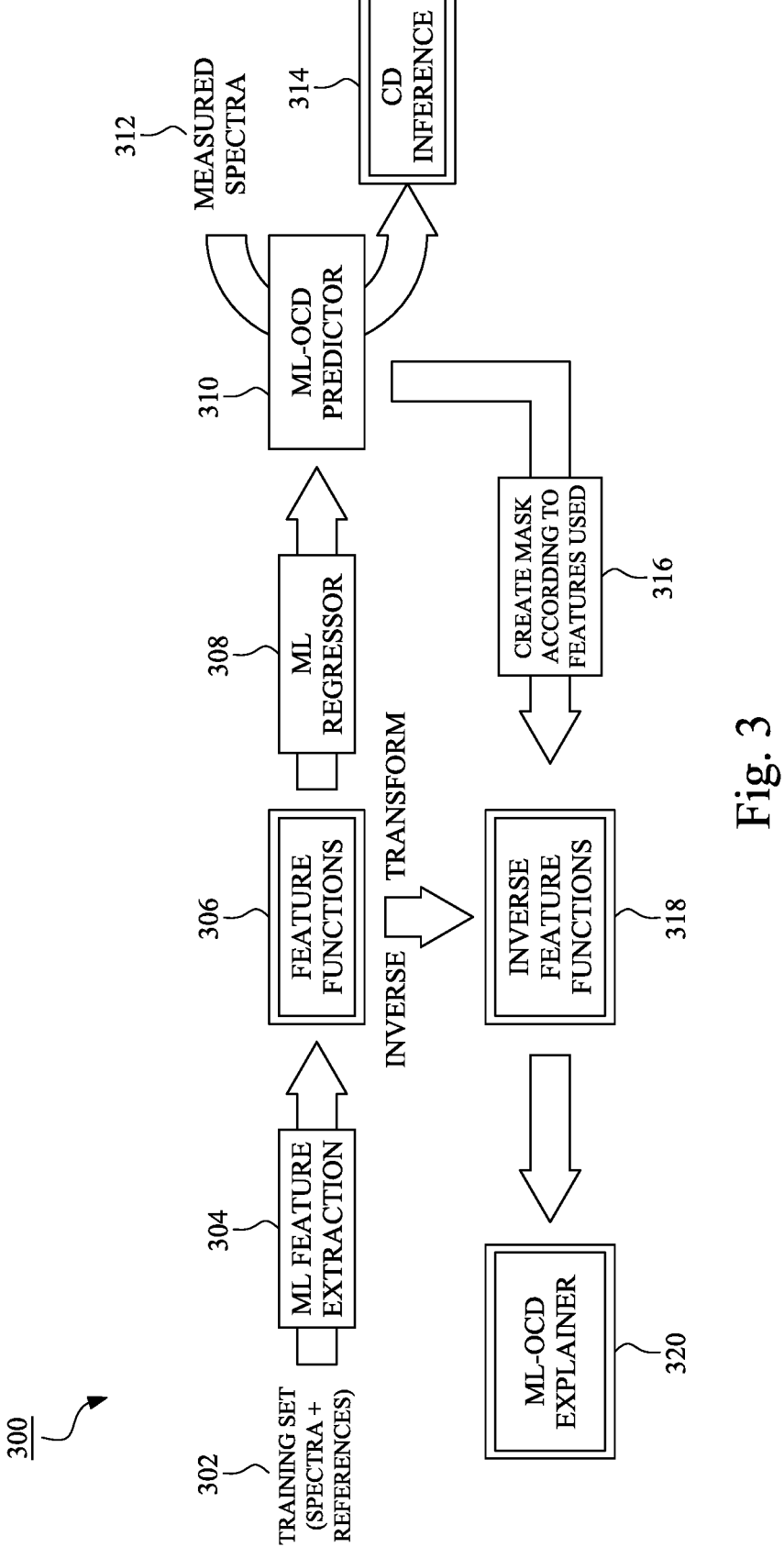
FIG. 3 is a functional block diagram illustrating a method implemented by the system of FIG. 1 in accordance with one embodiment.

Turning now to FIG. 3, there is depicted a functional block diagram illustrating a method 300 implemented by the system 100 of FIG. 1 in accordance with some embodiments to produce an ML-OCD explainer 160. The method of FIG. 3 begins at 302, whereupon the training set 130 comprising training spectra 132 and references 134 are retrieved from the associated database 120 by the analytical ML training component 150. That is, the training set 130 is retrieved from the associated database 120 or otherwise made accessible to the processor 102. At 304, the ML feature extraction component 152 extracts one or more features 153 from the training set 130. According to some embodiments, the features 153 may include, for example and without limitation, characteristics, properties and/or attributes extracted by statistical or machine learning functions from raw data. The analytical ML training component 150 then retrieves one or more feature functions 136 from the associated database 120 and applies the retrieved feature functions 136 to the extracted features 153 at 306.

At 308, the ML regressor component 154 receives output from the feature functions 136 to perform regression analysis, i.e., the process of estimating the relationship between a dependent variable and independent variables. The ML predictor component 156 then generates, at 310, predictor variables 140 as inputs to the ML algorithm 162 used by the analytical ML training component 150. In some embodiments, the predictor variables 140 may be stored in memory 104 of the ML computer system 101, in the associated database 120, or the like. At 312, the ML-OCD predictor component 156 receives measured spectra 202 for processing. A critical dimension inference is thereafter output at 314.

In some embodiments, conversion of the output at 314 into human readable form, the ML-OCD explainer component 160 is generated via steps 316-320. Accordingly, at 316, the predictor variables 140 output by the ML predictor component 156 are used by the mask creation component 158 to generate a mask 142 corresponding to a method of indicating the elements of a matrix (or vector) that should or should not be used, as discussed in greater detail above. In some embodiments, the mask 142 may be stored in memory 104 of the ML computer system 101, in the associated database 120, or the like.

At 318, the analytical ML training component 150 performs inverse feature transformation using one or more inverse feature functions 138. As discussed above, the inverse feature transformation may be used for reconstructing signals in feature form back into the form of raw data, i.e., spectra 132. Thereafter, at 320, the analytical ML training component 150 generates one or more ML-OCD explainer component(s) 160 configured to output model spectra and provide visualized CD-sensitive signals in accordance with the ML-OCD predictor component 156. In accordance with some embodiments, the output may be human-readable in format, e.g., graphical, textual, or the like.

Figure 4:
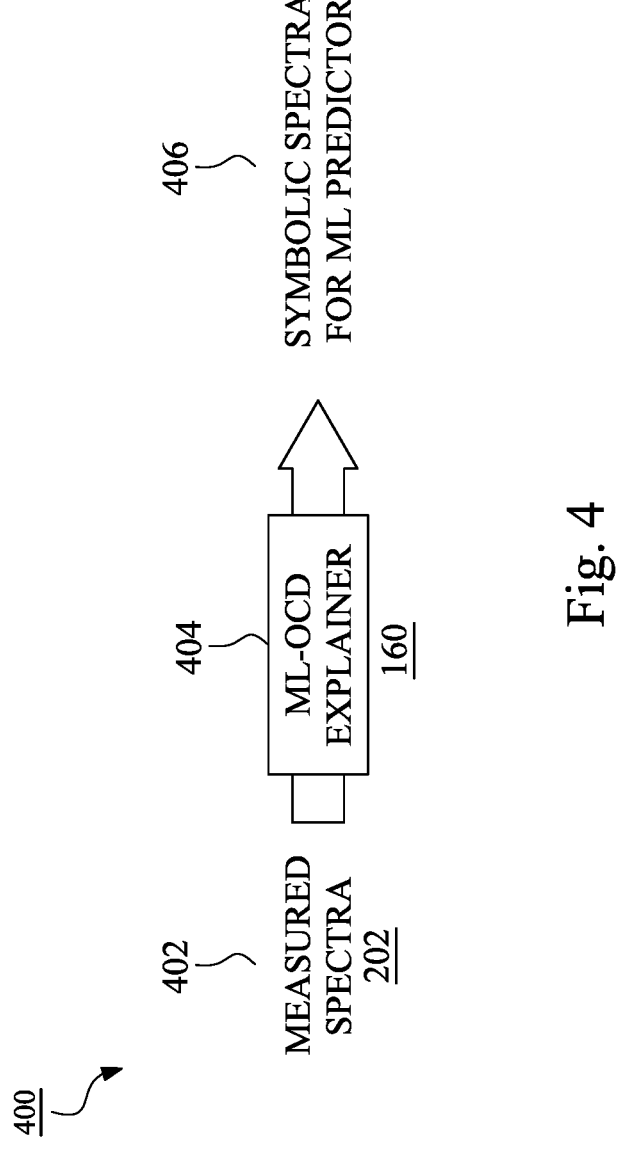
FIG. 4 is a functional block diagram illustrating a method implemented by the system of FIG. 1 in accordance with one embodiment.

Turning now to FIG. 4, there is shown a functional block diagram illustrating a method 400 implemented by the system 100 of FIG. 1 in accordance with some embodiments using the ML-OCD explainer 160 to produce symbolic spectra for the ML-predictor 156. As shown in FIG. 4, the method 400 begins at 402 with the retrieval of measured spectra 202 from the metrology tools 200 and/or semiconductor manufacturing systems 250. At 404, the ML-OCD explainer 160 receives the measured spectra 202 and outputs, at 406, symbolic spectra for use by the ML predictor 156.

Figure 5:
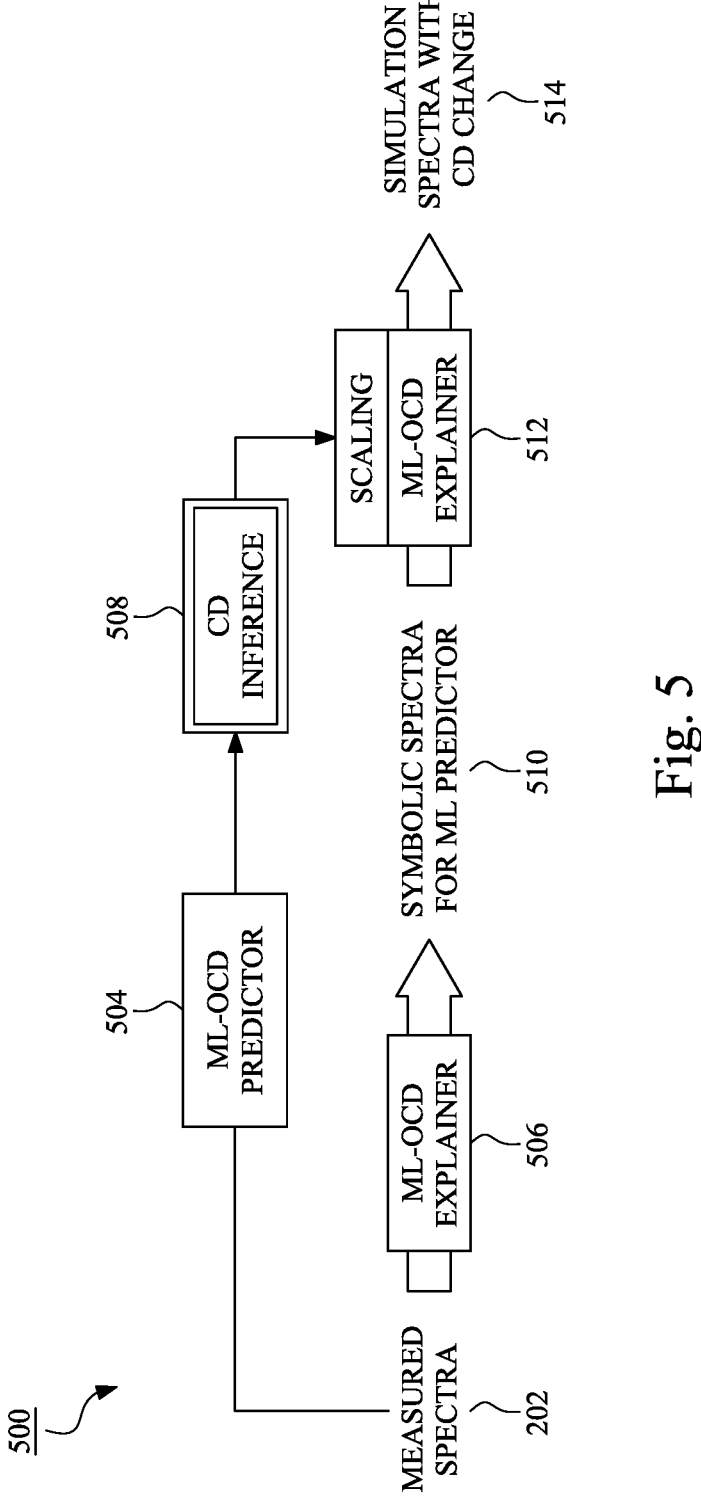
FIG. 5 is a functional block diagram illustrating a method implemented by the system of FIG. 1 in accordance with one embodiment.

FIG. 5 illustrates a functional block diagram illustrating a method 500 implemented by the system 100 of FIG. 1 using the ML-OCD explainer 160 in accordance with one embodiment. As shown in FIG. 5, measured spectra 202 is provided to the ML-predictor component 156 at 504 and the ML-OCD explainer component 160 at 506. A critical dimension (CD) inference is then made at 508, as the ML-OCD explainer component 160 outputs symbolic spectra at 510. Thereafter, the CD inference and symbolic spectra are scaled in by the ML-OCD explainer at 512. Simulated spectra with CD change are then output at 514. Stated another way, measured spectra 202 is processed by the ML-OCD predictor component 156 for identification of predictor variables 140 (as described above). The critical dimensions associated with the measured spectra 202 (and the predictor variables 140) are then inferred by the ML computer system 101 and combined with the symbolic spectra, scaled, and a simulated spectra having a change in CD is output.

Figure 6:
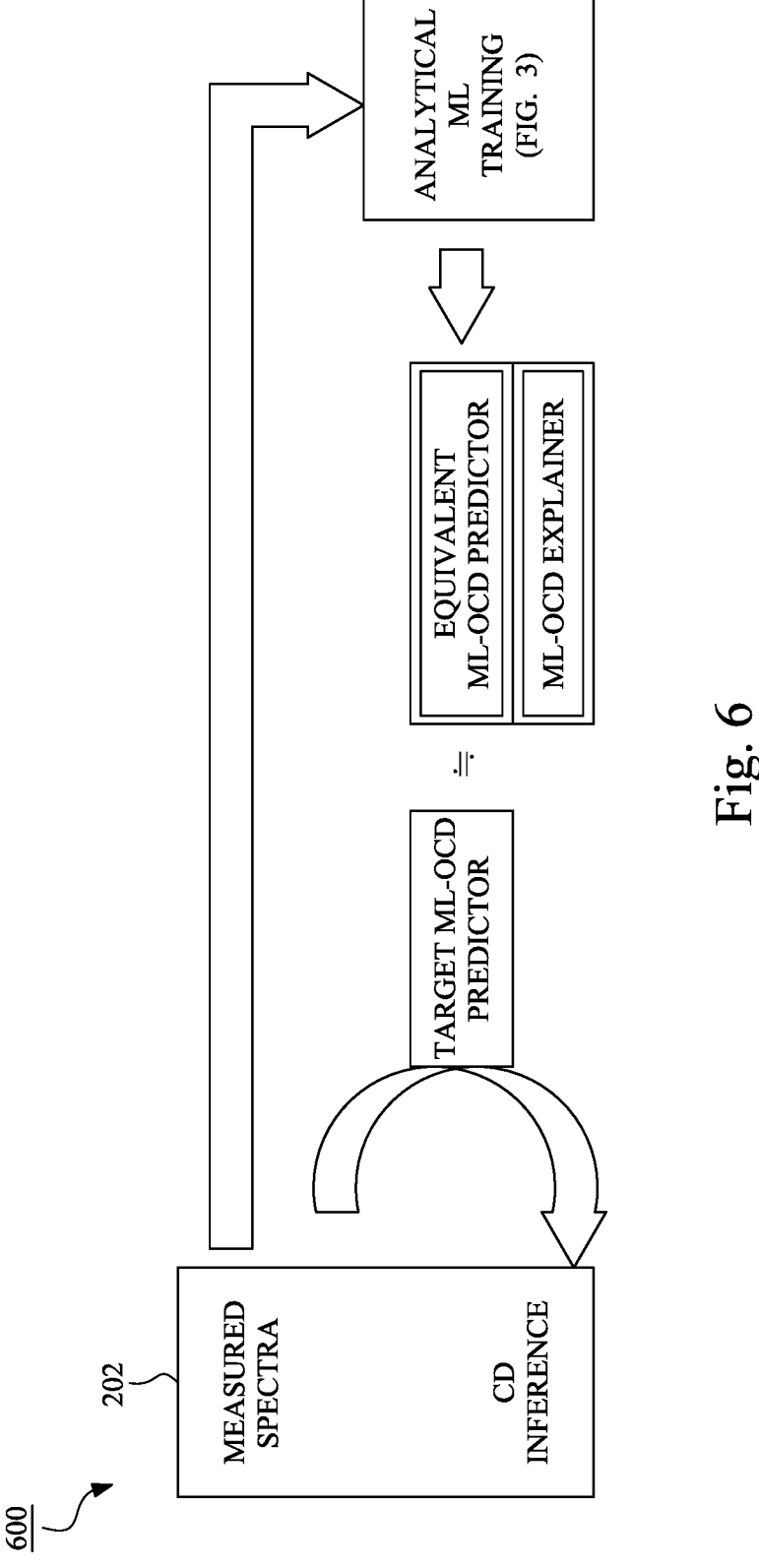
FIG. 6 is a functional block diagram illustrating a method implemented by the system of FIG. 1 in accordance with one embodiment.

Referring now to FIG. 6, there is shown a method 600 of utilizing the system 100 of FIG. 1 to transform existing ML-OCD models into analytical ML-OCD models. As shown in FIG. 6, the method utilizes the analytical ML training component 150 (described above) with measured spectra 202. The analytical ML training component 150 pools a sufficient quantity of spectra in a target ML-OCD predictor and obtains CD inference data. Thereafter, inverse ML training is performed using similar ML algorithm and the training data 130 previously obtained. An equivalent ML-OCD predictor is created to mimic the behavior of the target ML-OCD predictor. Concurrently with the implementation of the analytical ML method, an ML-OCD explainer is created.

Figure 7:
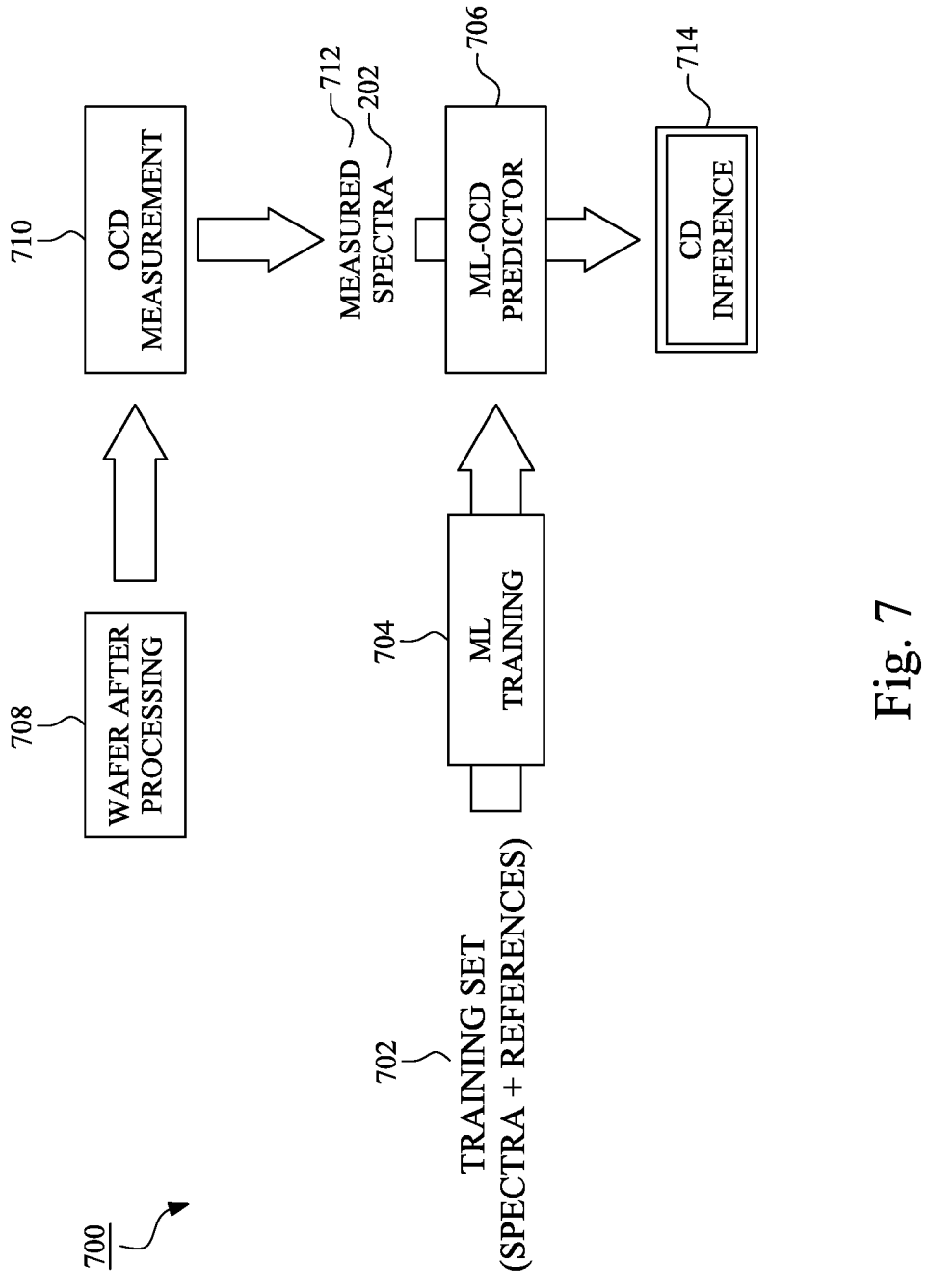
FIG. 7 is a functional block diagram illustrating a method implemented by the system of FIG. 1 in accordance with one embodiment.

Turning now to FIG. 7, there is shown a simplified operational diagram of the system 100 in accordance with one embodiment. As shown in FIG. 7, a training set 130 is provided at 702 to the analytical ML training component 150 at 704, as described above. At 706, an ML-OCD predictor 156 is created, as described in greater detail above. After training and generation of ML-OCD predictor 156, a wafer is processed (e.g., deposition, etching, or other semiconductor wafer processing operation or process) at 708. At 710, OCD measurements are performed on the processed wafer by metrology tools 200 or metrology components of an associated semiconductor manufacturing system 250. Measured spectra 202 is then output at 712 to the ML-OCD predictor component 156 at 706. Thereafter, CD inference is output at 714 by the ML-OCD predictor 156.

Figure 10:
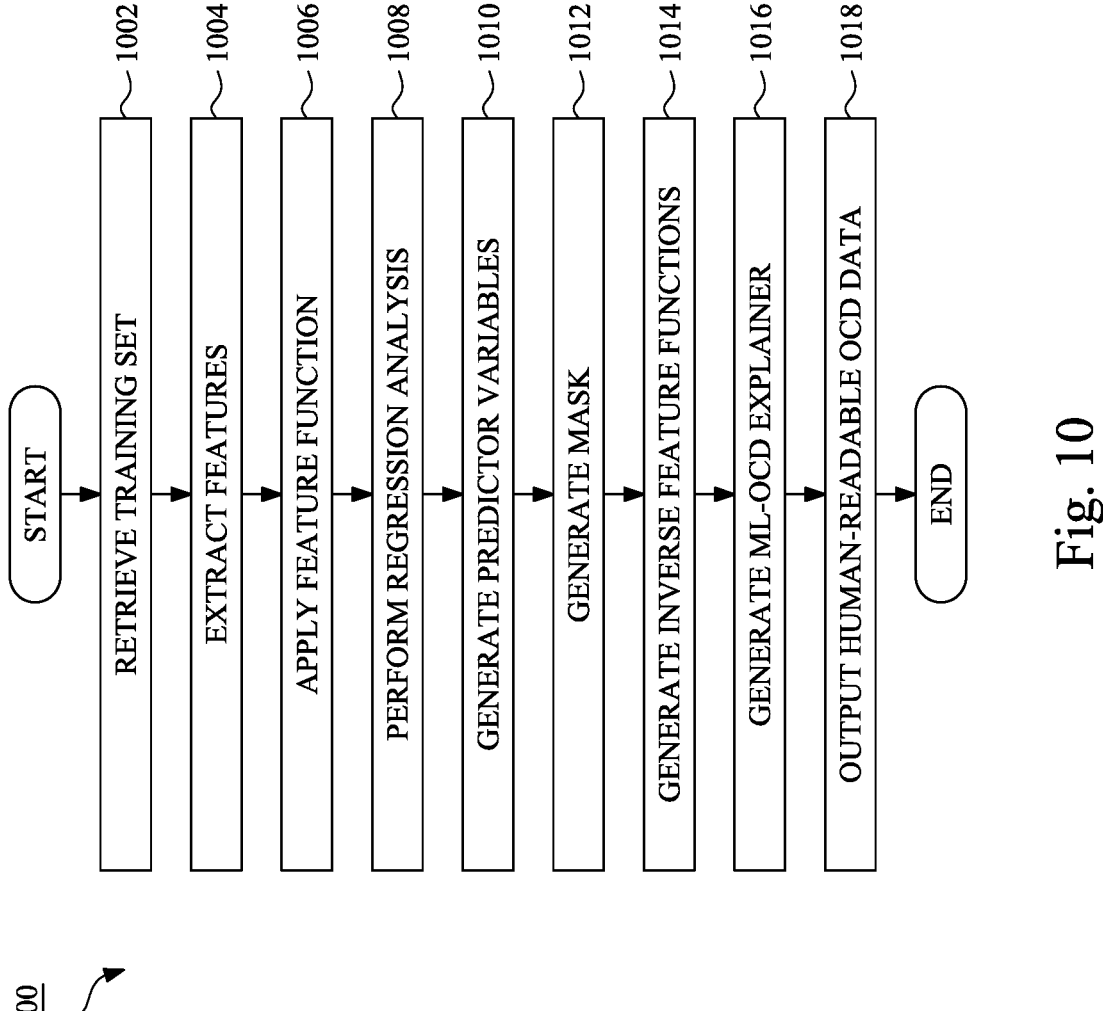
FIG. 10 illustrates a method for producing an ML-OCD explainer in accordance with one embodiment.

The various components and interactions described above with respect to FIGS. 1-7 will be better understood in conjunction with the flowchart of FIG. 10. FIG. 10 illustrates a method 1000 for producing an ML-OCD explainer 156 in accordance with one embodiment. That is, FIG. 10 provides an illustration of a spectral metrology assessment methodology in accordance with one embodiment. The method begins at 1002, whereupon an analytical ML training component 150 of the ML computer system 101 retrieves a training set 130 of data corresponding to spectra 132 and references 134 relating to semiconductor manufacturing. In accordance with one embodiment, the training set 130 relates to spectra 132 and references 134 of reference wafers having a variety of different structures, layers, and other features, the training set 130 indicative of critical dimension parameters for the reference wafers. At 1004, an ML feature extraction component 152 parses, i.e., analyzes the training set 130 to extract features 153 therefrom. That is, features 153 which may correspond to known OCD analysis corresponding to the known spectra resulting from structures on wafers are extracted from the training set 130.

At step 1006, the analytical ML training component 150 applies one or more feature functions 136 to the extracted features 153. In some embodiments the feature functions 136 correspond to mathematical functions used for extracting the aforementioned features 136 from raw data, such as, for example and without limitation, dimension reduction function. An ML regressor component 154 may then perform regression analysis at step 1008. In some embodiments, the regression analysis performed at step 1008 may correspond to estimating the relationship between a dependent variable and independent variables.

At step 1010, an ML-OCD predictor component 156 of analytical ML training component 150 generates (i.e., outputs) predictor variables 140 as inputs to the machine learning algorithm 162 of the analytical machine learning training component 150. At step 1012, a mask creation component 158 generates a mask 142 for use by the analytical machine learning training component 150 in OCD operations. In accordance with one embodiment, the mask 142 output by the mask creation component 158 may correspond to a method of indicating the elements of a matrix (or vector) that should or should not be used. In accordance with some embodiments, the predictor variables 140 and mask(s) 142 are resident in memory 104 of the ML computer system 101, as illustrated in FIG. 1, discussed above.

At step 1014, an inverse transform is performed on the feature functions to generate inverse feature functions 138. At step 1016, an ML-OCD explainer component 160 is generated to output model spectra and provide visualized CD-sensitive signals in accordance with the ML-OCD predictor component 156. In accordance with some embodiments, the output may be human-readable in format, e.g., graphical, textual, or the like. Thereafter, at step 1018, a human-readable output 144 is generated on an associated display 116 relating to OCD analysis of an associated wafer. That is, human-readable OCD data from the ML-OCD explainer component 160 is depicted on the associated display 116.

Figure 11:
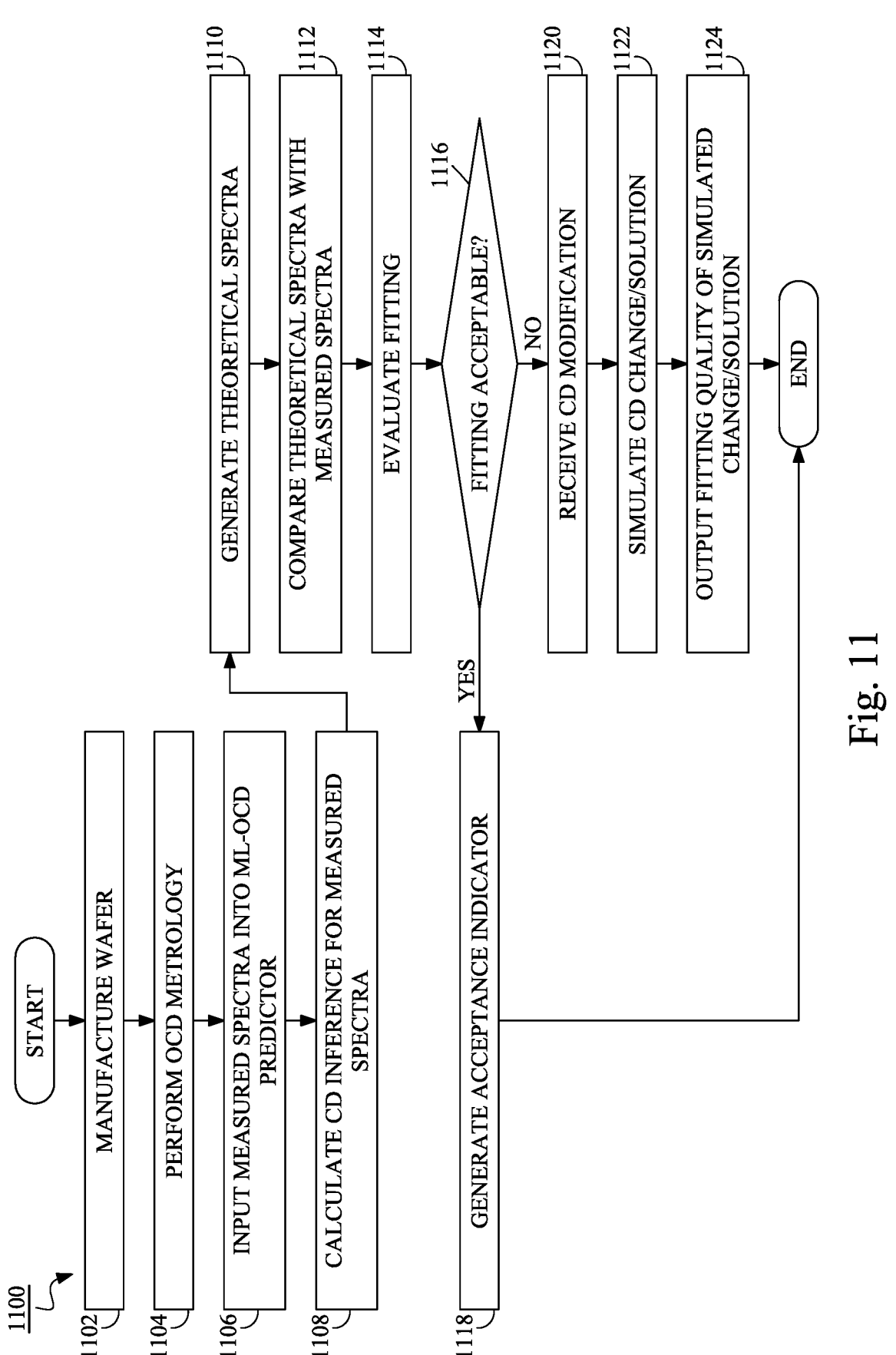
FIG. 11 illustrates a method for ML-OCD analysis in accordance with one embodiment.

Referring now to FIG. 11, there is shown a flowchart depicting a method 1100 for using the ML-OCD explainer component 160 produced from FIG. 10. The method begins at step 1102, whereupon a semiconductor wafer is manufactured by an associated semiconductor manufacturing system 250. In some embodiments, the wafer includes a variety of layers, structures, characteristics, etc. At step 1104, OCD metrology is performed on the wafer by one or more metrology tools 200 to generate measured spectra 202 from the wafer. That is, the metrology tool 200 or other suitable component associated with the system 100 performs optical measurement of an associated wafer, including, for example and without limitation X-ray reflectometry, X-ray fluorescence spectrometery, X-ray diffraction, and the like.

At step 1106, the measured spectra 202 is input into the ML-OCD predictor 156. At step 1108, CD inference for the measured spectra 202 of the associated wafer is calculated. Theoretical spectra are then generated at 1110 by the ML-OCD explainer component 160. The theoretical spectra are then compared to the measured spectra 202 at step 1112. At step 1114, the fitting of the measured spectra 202 with respect to the theoretical spectra is then evaluated. In some embodiments, the fitting may be displayed via the ML-OCD explainer component 160 in human-readable form. FIGS. 8-9 provide illustrative graphs of the fitting comparison. A determination is then made at step 1116 whether the fitting is acceptable, i.e., fits with the theoretical spectra. Upon a positive determination at step 1116, operations proceed to step 1118, whereupon an indication of acceptance of the wafer is generated, e.g., visual indicator, audible alarm, movement of the wafer out of the metrology tool 200, transfer of the wafer to finishing operations, etc. In some embodiments, the acceptance indication is generated via the ML-OCD explainer component 160 in conjunction with the visualization component 166. In some embodiments, the calculated critical dimension inference for the associated wafer and the acceptance indication are displayed via the readable form 144 on the associated display 116.

Figure 12:
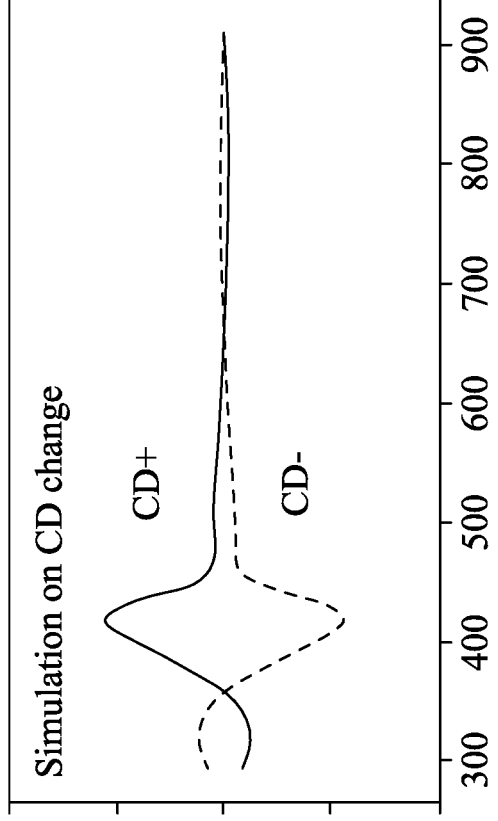
FIG. 12 provides an illustrative representation of a CD simulation in accordance with one embodiment.
Figure 13:
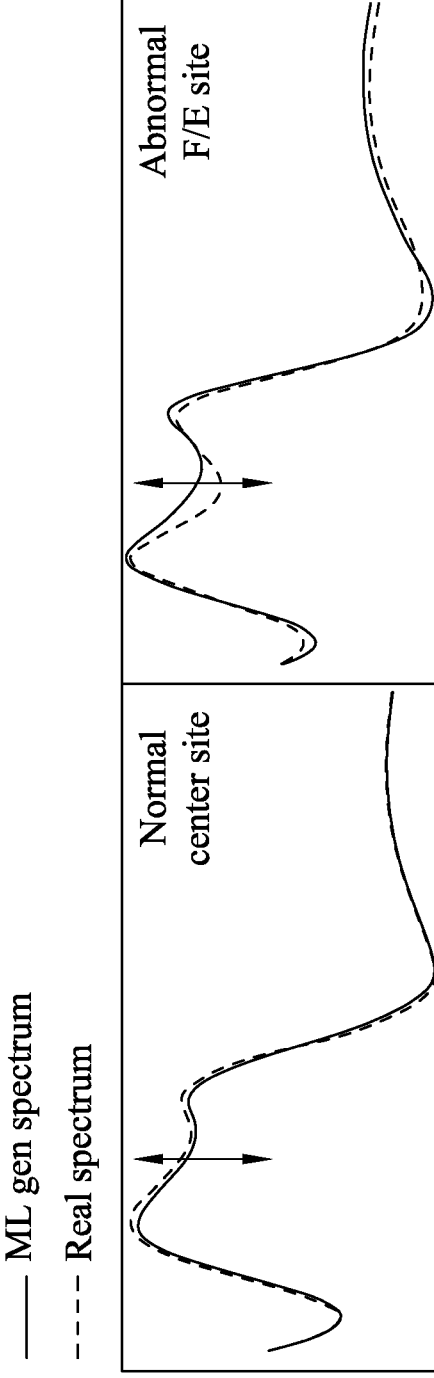
FIG. 13 provides an illustrative fitting quality visualization in accordance with one embodiment.

Upon a negative determination at 1116, operations proceed to step 1120, whereupon CD modification is received. The CD modification is then simulated at step 1122, i.e., spectra is generated corresponding to the change. That is, symbolic spectra are generated from the measured spectra and input into the ML-predictor component 156 as variables thereto. The ML-predictor component 156 then calculates the CD inference (as discussed above) for this symbolic spectra. FIG. 12 provides an illustrative representation of the simulation of step 1122. Thereafter, at step 1124, the fitting quality of the simulated change is output via the ML-OCD explainer component 160 and/or visualization component 166, as illustrated in FIG. 13.

In accordance with some embodiments disclosed herein, there are provided methods for generating an analytical machine-learning methodology for OCD analysis. Using the various training sets, the machine learning component may be trained to recognize correct (true) and incorrect (false) spectra generated by OCD metrology tools of processed wafers to infer critical dimensions thereof. Thus, the machine learning component may be used to determine what, if anything, went wrong during the manufacture of a wafer and then model solutions via an ML-OCD explainer component that outputs human-readable OCD data. By combining the inverse transformation technique and ML-OCD predictor, this model-less ML model can output best-fit spectra, fitting residual and spectral simulation among CD changes, similar to RCWA model-based OCD, but having faster and more accurate results. Accordingly, the methods provided herein can now calculate goodness-of-fit instead of confidence index, which may not align with the ML regressor due to the difference of algorithms. Stated another way, enabling the analytical ML functionality of the systems and methods described herein may bring physical principles and engineering experience into the building of ML-OCD solutions to prevent un-physical, over-learning, low-sensitivity solutions. The CD simulation function and goodness-of-fit of analytical ML provides ease of clarification of metrology issues, particularly in high-volume manufacturing facilities, as well as quantifying pre-layer signals for the assessment on applicability of ML-OCD models.

In accordance with a first embodiment, there is provided spectral metrology assessment method. The method includes retrieving, from an associated database, a training set that includes optical spectra acquired of reference wafers and a corresponding plurality of references indicative of critical dimension parameters for the reference wafers. The method also includes extracting features from the training set and performing regression analysis on the extracted features. The method further includes generating predictor variables for a machine-learning algorithm based on an output of the regression analysis of the extracted features, and generating a machine-learning optical critical dimension explainer. Additionally, the method includes outputting a visual representation of optical critical dimension measurements by the machine-learning optical critical dimension explainer on an associated display. In the first embodiment, the retrieving, extracting, performing, generating and outputting is performed by a processor in communication with memory.

In accordance with a second embodiment, there is provided an optical critical dimension method. The method includes performing optical measurement on a wafer by a metrology tool for measured spectra. The method also includes calculating a critical dimension inference for the associated wafer from the measured spectra using a machine-learning predictor component, and a plurality of theoretical spectra by the machine learning predictor component in accordance with a training set comprising of training spectra. The method further includes comparing the measured spectra to the theoretical spectra, and evaluating a fitting of the measured spectra to the theoretical spectra. Additionally, the method includes generating an acceptance indicator for the calculated critical dimension inference for the associated wafer in response to the output of the evaluation. In the second embodiment, the performing, calculating, generating, evaluating, and generating is performed by a processor in communication with memory.

In accordance with a third embodiment, there is provided a system for optical critical dimension measurement. The system includes a computer that includes a processor in communication with memory that stores instructions that are executed by the processor. The instructions direct the processor to retrieve a training set from an associated database that includes spectra and corresponding references, and to extract features from the training set. The memory further stores instructions to regression analysis on the extracted features by a regression component and to generate predictor variables for a machine-learning predictor component based upon the output of the regression component. Additionally, the memory stores instructions to generate a machine-learning optical critical dimension explainer, and to output, by the machine-learning optical critical dimension explainer, a visual representation of optical critical dimension measurements on an associated display.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

15 16

What is claimed is:

1. An optical critical dimension method, comprising:

performing optical measurement of an associated wafer by an associated metrology tool, the measurement including a plurality of measured spectra;

calculating a critical dimension inference from the plurality of measured spectra using a machine-learning predictor component;

generating a plurality of theoretical spectra for the associated wafer by the machine learning predictor component in accordance with a training set comprising a plurality of training spectra;

generating a machine learning optical critical dimension (ML-OCD) explainer based on a mask and one or more inverse feature functions extracted from the training set, and applying the generated inverse feature functions to generated predictor variables based on performing a regression analysis on the extracted plurality of inverse feature functions subsequent to application of the mask, and combining the applied inverse feature functions with the mask;

comparing the measured spectra to the theoretical spectra;

evaluating a fitting of the measured spectra to the theoretical spectra; and generating an acceptance indicator for the calculated critical dimension inference for the associated wafer responsive to an output of the evaluation;

receiving a modification to the critical dimensionality of the measured spectra;

simulating the modification in critical dimensionality of the measured spectra in response to an output of the evaluation by inputting into the ML-OCD explainer the measured spectra and the received change in critical dimensionality; and outputting a fitting quality of the simulated change in critical dimensionality on an associated display, wherein at least one of the performing, calculating, generating, evaluating, and generating is performed by a processor in communication with memory.

2. The method of claim 1, wherein simulating the change in critical dimensionality further comprises:

outputting, by the ML-OCD explainer, symbolic spectra corresponding to the received change in critical dimensionality.

3. The method of claim 2, wherein simulating the change in critical dimensionality of the of the measured spectra further comprises:

comparing the symbolic spectra to the theoretical spectra; and evaluating a fitting of the measured spectra to the theoretical spectra.

4. An optical critical dimension method comprising:

performing optical measurement of an associated wafer by an associated metrology tool, the measurement including a plurality of measured optical spectra;

using a machine learning (ML) model to determine a critical dimension inference from the plurality of measured optical spectra, the ML learning model trained using a training set including a plurality of training optical spectra;

generating a plurality of theoretical optical spectra for the associated wafer by a machine learning predictor component in accordance with the training set;

comparing the measured optical spectra to the theoretical spectra;

evaluating a fitting of the measured optical spectra to the theoretical optical spectra; and generating an acceptance indicator for the calculated critical dimension inference for the associated wafer responsive to an output of the evaluation, wherein the ML learning model is trained by a training method comprising:

retrieving, from at least one associated database, the training set including the plurality of training optical spectra acquired from a plurality of reference wafers and the training set including a corresponding plurality of references indicative of critical dimension parameters for the plurality of reference wafers;

extracting, from the training set, a plurality of features;

performing regression analysis on the plurality of extracted features;

generating predictor variables for a machine learning algorithm associated with the ML learning model in accordance with an output of the regression analysis on the plurality of extracted features;

generating a machine learning optical critical dimension explainer based on a mask and the plurality of extracted features from the training set, and combining the mask with generated inverse feature functions based on the plurality of extracted features; and outputting, by the machine learning optical critical dimension explainer, a visual representation of optical critical dimension measurements on an associated display, wherein at least one of the retrieving, extracting, performing, calculating, generating, evaluating, and outputting is performed by a processor in communication with memory.

5. The method of claim 4, wherein the training method further comprises applying a feature function to the extracted plurality of features, wherein the regression analysis is performed on a result of the feature function application.

6. The method of claim 5, wherein the training method further comprises generating an inverse feature function corresponding to the applied feature function.

7. The method of claim 6, wherein the training method further comprises generating a mask for application of at least one of the regression analysis output or the generated predictor variables.

8. The method of claim 7, wherein the training method further comprises applying the generated mask to the generated predictor variables.

9. The method of claim 8, wherein the training method further comprises applying the generated inverse feature function to the generated predictor variables subsequent to application of the generated mask.

10. The method of claim 9, wherein the machine learning optical critical dimension explainer is configured to:

generate a visualization of a fitting process corresponding to combining the applied inverse feature functions with the mask.

11. The method of claim 4, wherein the machine learning algorithm is at least one of a neural network, fast Fourier Transform (FFT), principal component analysis (PCA), support vector machine (SVM), Gaussian processing, lasso regression, ordinary least squares regression (OLSR), linear regression, logistic regression, stepwise regression, multivariate adaptive regression splines (MARS), locally estimated scatterplot smoothing (LOESS), or partial least squares regression (PLSR).

12. The method of claim 4, wherein the optical spectra is obtained using at least one of X-ray reflectometry, X-ray fluorescence spectrometry, or X-ray diffraction.

13. An optical critical dimension method comprising:

performing optical measurement of an associated wafer by an associated metrology tool, the measurement including a plurality of measured spectra;

using a machine learning (ML) model to determine a critical dimension inference from the plurality of measured spectra, the ML learning model trained using a training set including a plurality of training spectra;

comparing the measured spectra to reference spectra data generated from the training set;

generating a machine-learning optical critical dimension explainer based on a mask and one or more inverse feature functions extracted from the training set, applying the generated inverse feature functions to generated predictor variables based on performing a regression analysis on the extracted plurality of inverse feature functions subsequent to application of the mask to the generated predictor variable, and combining the applied inverse feature functions with the mask and outputting, by the machine-learning optical critical dimension explainer, a visual representation of optical critical dimension measurements on an associated display; and generating an acceptance indicator for the calculated critical dimension inference for the associated wafer responsive to an output of the evaluation, receiving a modification to the critical dimensionality of the measured spectra;

simulating the modification in critical dimensionality of the measured spectra in response to an output of the evaluation by inputting into the ML-OCD explainer the measured spectra and the received change in critical dimensionality; and outputting a fitting quality of the simulated change in critical dimensionality on an associated display, wherein at least one of the performing, calculating, generating, evaluating, and generating is performed by a processor in communication with memory.

14. The method of claim 13 further comprising, generating the machine learning optical critical dimension explainer based on a mask and the one or more inverse feature functions extracted from the training set.

15. The method of claim 13, wherein the machine learning optical critical dimension explainer is configured to:

generate a visualization of a fitting process corresponding to combining the applied inverse feature functions with the mask.

16. The method of claim 13, wherein the machine learning algorithm is at least one of a neural network, fast Fourier Transform (FFT), principal component analysis (PCA), support vector machine (SVM), Gaussian processing, lasso regression, ordinary least squares regression (OLSR), linear regression, logistic regression, stepwise regression, multivariate adaptive regression splines (MARS), locally estimated scatterplot smoothing (LOESS), or partial least squares regression (PLSR).

17. The method of claim 13, wherein the optical spectra is obtained using at least one of X-ray reflectometry, X-ray fluorescence spectrometry, or X-ray diffraction.

* * * * *